United States Patent
Crowder et al.

(10) Patent No.: US 10,115,885 B2
(45) Date of Patent: Oct. 30, 2018

(54) FLUIDIC ASSEMBLY PROCESS USING PIEZOELECTRIC PLATES

(71) Applicant: eLux Inc., Vancouver, WA (US)

(72) Inventors: Mark Albert Crowder, Portland, OR (US); Changqing Zhan, Vancouver, WA (US); Karen Nishimura, Washougal, WA (US); Paul Schuele, Washougal, WA (US)

(73) Assignee: eLux, Inc., Vancouver, WA (US)

( * ) Notice: Subject to any disclaimer, the term of this patent is extended or adjusted under 35 U.S.C. 154(b) by 241 days.

(21) Appl. No.: 15/244,838

(22) Filed: Aug. 23, 2016

(65) Prior Publication Data

US 2017/0352797 A1 Dec. 7, 2017

Related U.S. Application Data

(63) Continuation-in-part of application No. 15/171,521, filed on Jun. 2, 2016.

(51) Int. Cl.
*H01L 41/09* (2006.01)
*H01L 41/22* (2013.01)
(Continued)

(52) U.S. Cl.
CPC ........ *H01L 41/1132* (2013.01); *H01L 41/311* (2013.01); *H01L 41/313* (2013.01);
(Continued)

(58) Field of Classification Search
CPC ... H01L 41/1132; H01L 41/311; H01L 41/313
(Continued)

(56) References Cited

U.S. PATENT DOCUMENTS

| 4,001,798 A * | 1/1977 | Robinson | G01L 1/16 299/1.2 |
| 2006/0181083 A1* | 8/2006 | Steigerwald | H02J 7/32 290/1 A |

(Continued)

OTHER PUBLICATIONS

Omori et al., "Preparation of piezoelectric PZT micro-discs by sol-gel method", IEEJ Transactions on Sensors and Micromachines 121(9):496-500 • Dec. 2000.
(Continued)

*Primary Examiner* — Thomas Dougherty
(74) *Attorney, Agent, or Firm* — Law Office of Gerald Maliszewski; Gerald Maliszewski

(57) ABSTRACT

A method is provided for fabricating a thin-film electronic device employing a piezoelectric plate. The method provides a plurality of piezoelectric plates, and a substrate with electronic devices, each electronic device including a top surface well. A piezoelectric plate suspension is formed and flowed over the substrate. In response to the piezoelectric plate suspension flow, piezoelectric plates are captured in the top surface wells. The electric device top surface wells have well bottom surfaces, with bottom electrical contacts formed on the bottom surfaces. Thus, the capture of a piezoelectric plate in a top surface well entails interfacing a piezoelectric plate electrode, either the first electrode or the second electrode, to the bottom electrical contact. Subsequent to capturing the piezoelectric plates in the top surface wells, a thin-film process forms a conductive line overlying the exposed piezoelectric device electrode (i.e., the electrode not connected to the bottom electrical contact).

19 Claims, 6 Drawing Sheets

(51) Int. Cl.
  *H01L 41/113* (2006.01)
  *H01L 41/311* (2013.01)
  *H01L 41/313* (2013.01)
  *H01L 41/187* (2006.01)
  *H01L 41/193* (2006.01)

(52) U.S. Cl.
  CPC ...... *H01L 41/1871* (2013.01); *H01L 41/1873* (2013.01); *H01L 41/1876* (2013.01); *H01L 41/193* (2013.01)

(58) Field of Classification Search
  USPC .................. 310/311–371, 800; 29/25.35
  See application file for complete search history.

(56) References Cited

U.S. PATENT DOCUMENTS

2008/0246025 A1* 10/2008 Nomura .............. H01L 27/1214
  257/40
2010/0295487 A1* 11/2010 Li ........................ H02N 2/147
  318/116

OTHER PUBLICATIONS

Ijjima et al., "Fabrication of Lead Zirconate Titanate Thick Film Disks for Micro Transducer Devices", MRS Proceedings, 785, D4.5 doi:10.1557/PROC-785-D4.5.

* cited by examiner

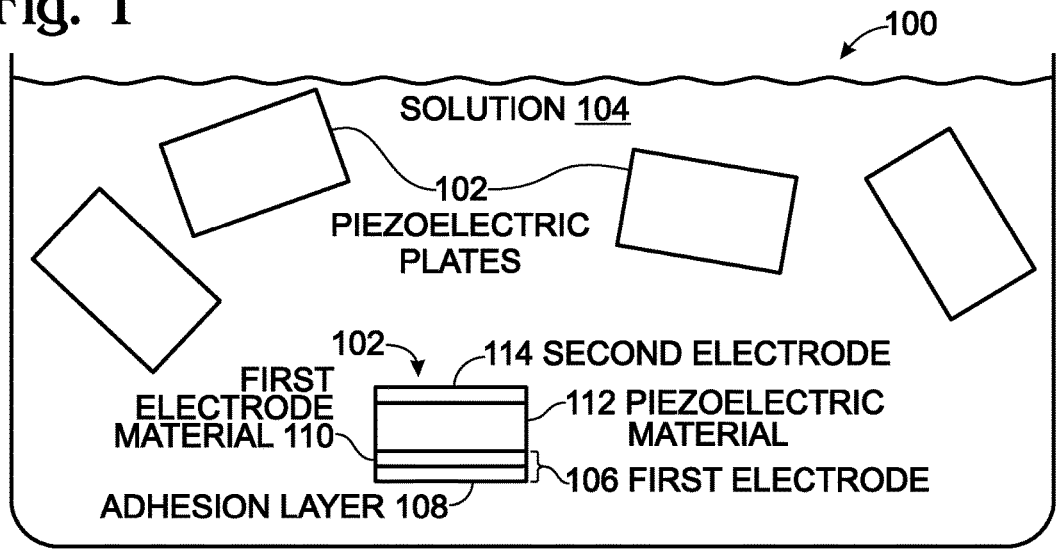
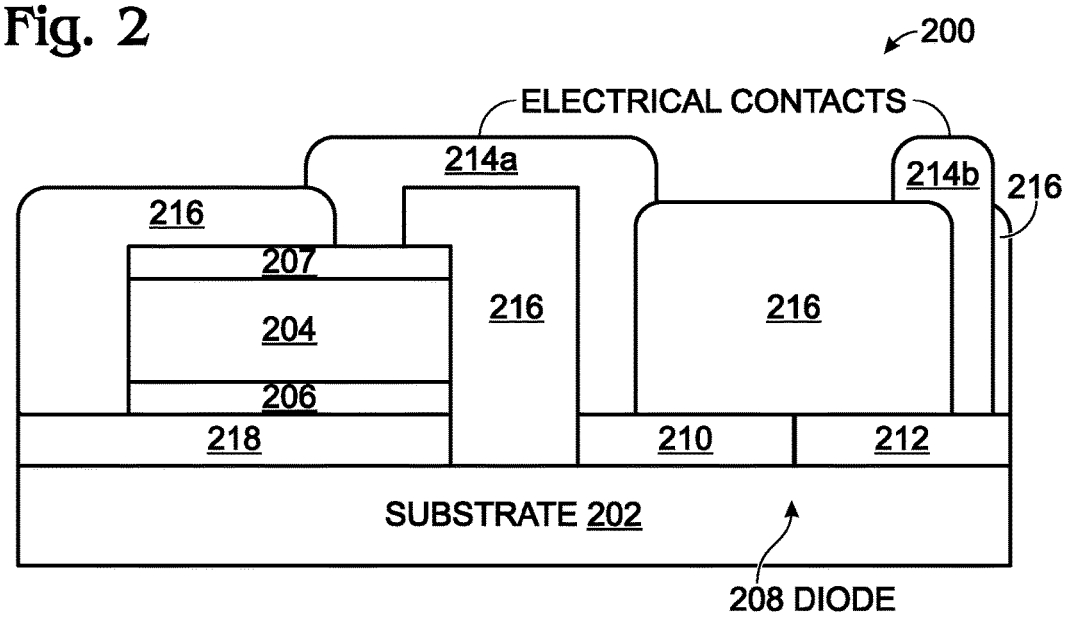

FLUIDIC ASSEMBLY PROCESS USING PIEZOELECTRIC PLATES

RELATED APPLICATIONS

This application incorporates by reference an application entitled, FABRICATION AND HARVEST OF PIEZOELECTRIC PLATES, invented by M. Albert Crowder et al., Ser. No. 15/171,521, filed Jun. 2, 2016.

BACKGROUND OF THE INVENTION

1. Field of the Invention

This invention generally relates to thin-film device fabrication and, more particularly, to a fluidic process for the fabrication of microelectronic devices incorporating piezoelectric structures requiring high temperature annealing.

2. Description of the Related Art

Ceramic piezoelectric materials such as lead zirconate titanate (PZT) or barium titanate ($BaTiO_3$) have a high piezoelectric coefficient that allows for their use in high-sensitivity ultrasonic sensors or energy harvesters. However, the formation of such materials typically requires high sintering temperatures that are incompatible with low-cost, high-temperature-intolerant substrates such as glasses or plastics.

Polymer piezoelectric materials such as copolymers of polyvinylidene fluoride (PVDF) or polyvinylidene fluoride co-polymer (P(VDF-TrFE)) can be readily made through spin-coating onto a growth substrate. As such, they are compatible with conventional thin-film fabrication processes. However, the piezoelectric coefficient of these polymer materials is typically 25 times lower than that for the ceramic piezoelectric materials, thereby limiting the sensitivity of the ultrasonic sensor array.

FIG. 7 is a schematic diagram of an exemplary piezoelectric sensor (prior art). Integration steps that add polymer piezoelectric coatings to sensor circuitry during thin-film fabrication can affect the ferroelectric domains of these materials, adding complexity to the fabrication process. It is also beneficial to isolate the poling of piezoelectric materials, whether polymer or ceramic, from the device wafer, as high electric fields necessary for poling can damage nearby microelectronics.

PZT disks can be formed on a growth substrate in a variety of ways, including the molding of a sol-gel PZT precursor or chemical solution deposition of sol-gel PZT. As shown in the literature, PZT disks can be formed with a thickness of 1 micron ($\mu$m) and a diameter of 80-200 $\mu$m. The latter was used to for larger, thicker disks with thicknesses of 10 $\mu$m and diameters of 100-500 $\mu$m. By forming the disks on a separate growth substrate, the sintering process can be carried out using optimized conditions for forming the PZT material (e.g., sintering at 650° C. for several hours). However, these disks are formed on a planar bottom electrode that is continuous between all the disks. There is a very limited use for such a structure. Further, there has been no means demonstrated for separating these disks from the growth substrate, or forming the disks into individual electrical devices. Thus, the direct transfer of PZT or other ceramic materials is costly and has limited scalability.

It would be advantageous if a large scale process existed for fabricating microelectronic sensors with high annealing temperature ceramic piezoelectric structures. It would be advantageous if this fabrication process could be enabled using fluidic techniques.

SUMMARY OF THE INVENTION

Disclosed herein is a structure and method for fluidically aligning disks formed from piezoelectric materials into an array on a receiving substrate. Such piezoelectric materials can be fabricated on a growth wafer at high density, including all high-temperature processing and poling, and subsequently harvested into a suspension for distribution at a lower density onto a substrate that is incompatible with the processing conditions require for the piezoelectric material formation. The use of harvested piezoelectric disks ensures the completion of all processing of the piezoelectric material prior to harvesting from a growth substrate, as well as a means of isolating the fabrication of controller microelectronics from the piezoelectric materials. The piezoelectric disks can be aligned in an array to enable a variety of applications such as an ultrasonic sensor for a touchscreen or imaging sensor, structural or personal health monitor, or ferroelectric memory.

Lead zirconium titanate (PZT) disks can be formed on a growth substrate in a variety of ways, including the molding of a sol-gel PZT precursor or chemical solution deposition of sol-gel PZT. By forming the disks on a separate growth substrate, the sintering process can be carried out using optimized conditions for forming the PZT material (e.g., sintering at 650° C. for several hours). The disks can be formed on the growth substrate with top and bottom metal electrodes for low contact resistance.

Accordingly, a method is provided for fabricating a thin-film electronic device employing a piezoelectric plate. The method provides a plurality of piezoelectric plates, each piezoelectric plate having a polygon shape (e.g., disk shape) and a piezoelectric layer. A first electrode overlies a first surface of the piezoelectric layer, and a second electrode overlies a second surface of the piezoelectric layer. The method also provides a substrate with a plurality of electronic devices, each electronic device including a top surface well. A piezoelectric plate suspension is formed and flowed over the substrate. In response to the piezoelectric plate suspension flow, piezoelectric plates are captured in the top surface wells.

In more detail, the electric device top surface wells have well bottom surfaces, with bottom electrical contacts formed on the bottom surfaces. Thus, the capture of a piezoelectric plate in a top surface well entails interfacing a piezoelectric plate electrode, either the first electrode or the second electrode, to the bottom electrical contact. Subsequent to capturing the piezoelectric plates in the top surface wells, a thin-film process forms a conductive line overlying the exposed piezoelectric device electrode (i.e., the electrode not connected to the bottom electrical contact).

Besides PZT, the piezoelectric plates may be a material such as barium titanate ($BaTiO_3$), polyvinylidene fluoride (PVDF), a polyvinylidene fluoride co-polymer (P(VDF-TrFE)), quartz, zinc oxide (ZnO), aluminum nitride (AlN), or lanthanum-doped lead zirconium titanate (PZLT).

The first and second electrode material may be platinum (Pt), palladium (Pd), ruthenium oxide ($RuO_2$), or gold (Au). In one aspect, an adhesion layer is formed between the first electrode and the piezoelectric layer, where the adhesion layer is a material such as titanium (Ti), nickel (Ni), or chromium (Cr).

Typically, the piezoelectric plates have been annealed at a first temperature to induce poling of the piezoelectric material. For example, if the piezoelectric plates have a PZT piezoelectric layer, then they may have been annealed at a first temperature of greater than 650° C. This is advantageous, since a glass substrate has a strain point of about 650 degrees C., or less, and a plastic substrate has an upper working temperature of about 150 degrees C., or less.

Additional details of the above-described method and a piezoelectric sensor are provided below.

BRIEF DESCRIPTION OF THE DRAWINGS

FIG. 1 is a partial cross-sectional view of a fluidic assembly solution of piezoelectric plates.

FIG. 2 is a cross-sectional view of a first exemplary piezoelectric sensor.

DETAILED DESCRIPTION

Figure 3:
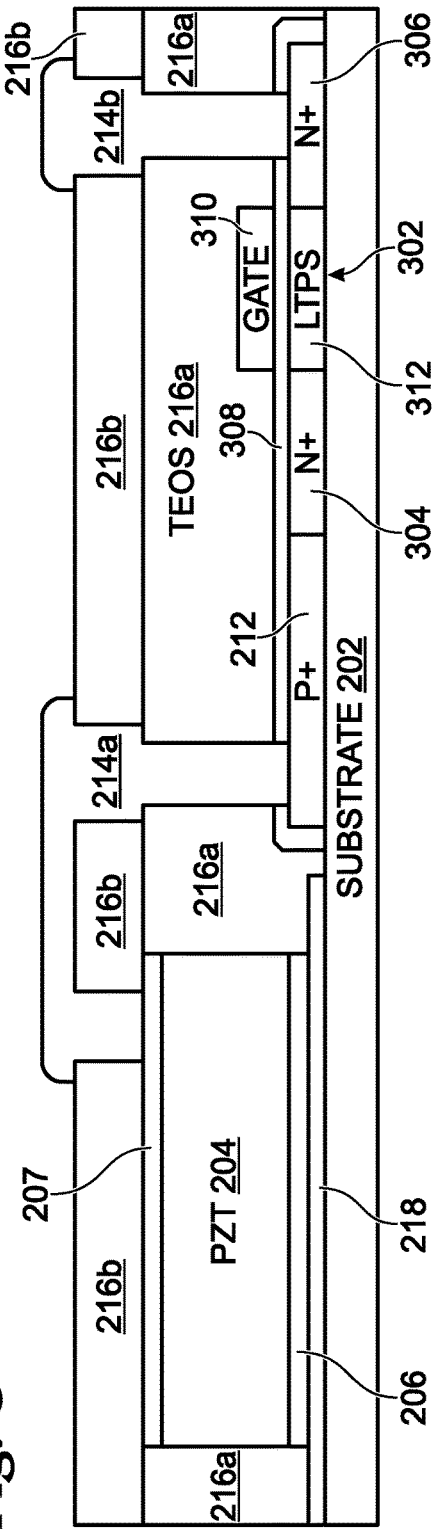
FIG. 3 is a cross-sectional view of a second exemplary piezoelectric sensor.

FIG. 1 is a partial cross-sectional view of a fluidic assembly solution 100 of piezoelectric plates. A plurality of piezoelectric plates 102 are suspended in a solution 104. Each plate 102 comprises a planar first electrode 106 having an adhesion layer 108/first electrode material 110 stack. A piezoelectric material 112 overlies the first electrode material 110, and a planar second electrode 114 overlies the piezoelectric material. For clarity, only one piezoelectric plate is shown in detail. Note: the second electrode is not necessarily a "top" electrode, as the plates are not aligned in any particular manner when in solution.

The piezoelectric material 112 may be one of the following: lead zirconium titanate (PZT), barium titanate (BaTiO$_3$), polyvinylidene fluoride (PVDF), polyvinylidene fluoride co-polymers (P(VDF-TrFE), quartz, zinc oxide (ZnO), aluminum nitride (AlN), or lanthanum-doped lead zirconium titanate (PZLT). However, the piezoelectric plates are not limited to any particular type of piezoelectric material. The first electrode material 110 may be platinum (Pt), palladium (Pd), ruthenium oxide (RuO$_2$), or gold (Au). The second electrode material 114 may also be Pt, Pd, RuO$_2$, or Au. The first and second electrode materials need not be the same. The adhesion layer 108 is a material such as (Ti), nickel (Ni), or chromium (Cr). In one aspect, the piezoelectric plates are in the shape of a disk—circular with planar "top" and "bottom" surfaces. However, other polygon shapes are also useful.

FIG. 2 is a cross-sectional view of a first exemplary piezoelectric sensor. The piezoelectric sensor 200 comprises a substrate 202. A typical glass substrate may have a strain point of about 650 degrees C., or less. If the substrate 202 is plastic, it may have an upper working temperature of about 150 degrees C., or less. A piezoelectric disk 204 overlies the substrate 202 having a bottom electrode 206 and a top electrode 207. A diode 208 has an anode 210 connected to the piezoelectric disk top electrode 207, and a cathode 212 to supply a sensor output. Also shown are top surface electrical contact 214a, via electrical contact 214a and 214b, an electrical insulator or dielectric material 216, and a reference voltage contact 218 (e.g., ground).

If the substrate is flexible, then the piezoelectric sensor can be a device that wraps around a structure to look for aging defects, for example, or a human limb for health-related measurements. Otherwise, the sensor device may be part of a touchscreen or memory array.

FIG. 3 is a cross-sectional view of a second exemplary piezoelectric sensor. In addition to the elements described in FIG. 3, this piezoelectric sensor 300 further comprises a thin-film transistor (TFT) 302 having a first source/drain (S/D) region 304 (in this example N+) connected to the diode cathode 212 (in this example P+) and a second S/D region 306 to supply the sensor output. In this view the diode anode 210 cannot be seen as it is extending into the page "behind" the cathode 212. The insulator has been differentiated into a tetraethyl orthosilicate (TEOS) layer 216a and an overlying photopatternable polyimide layer 216b. The TFT 302 further comprises a gate dielectric layer 308, gate electrode 310, and channel region 312 made from a low temperature polysilicon (LTPS) in this example. In this example, the piezoelectric material is PZT.

Figure 4A:
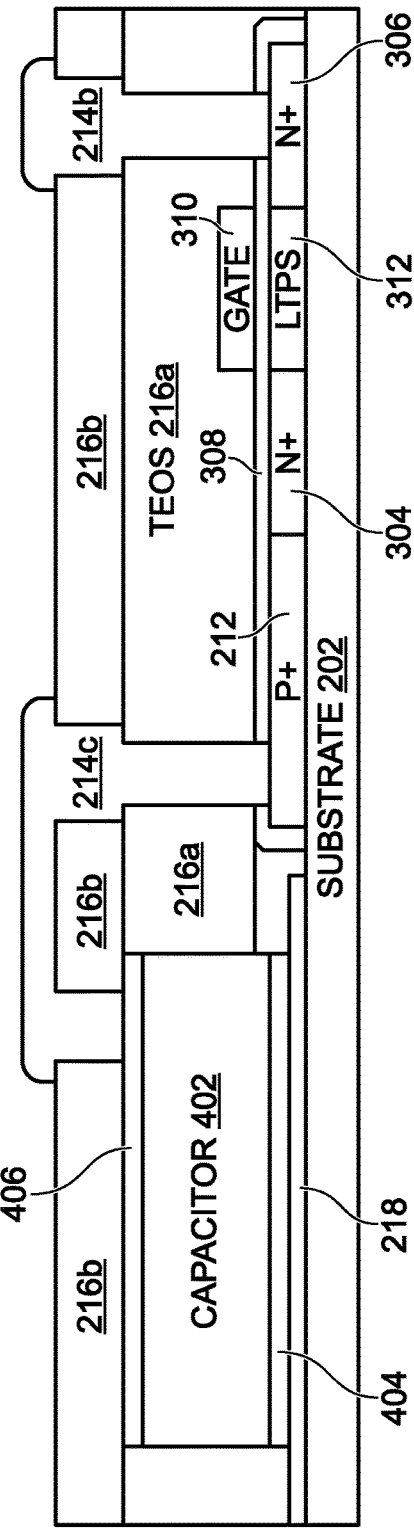
FIGS. 4A and 4B are, respectively, cross-sectional and plan views of a third exemplary piezoelectric sensor.
Figure 4B:
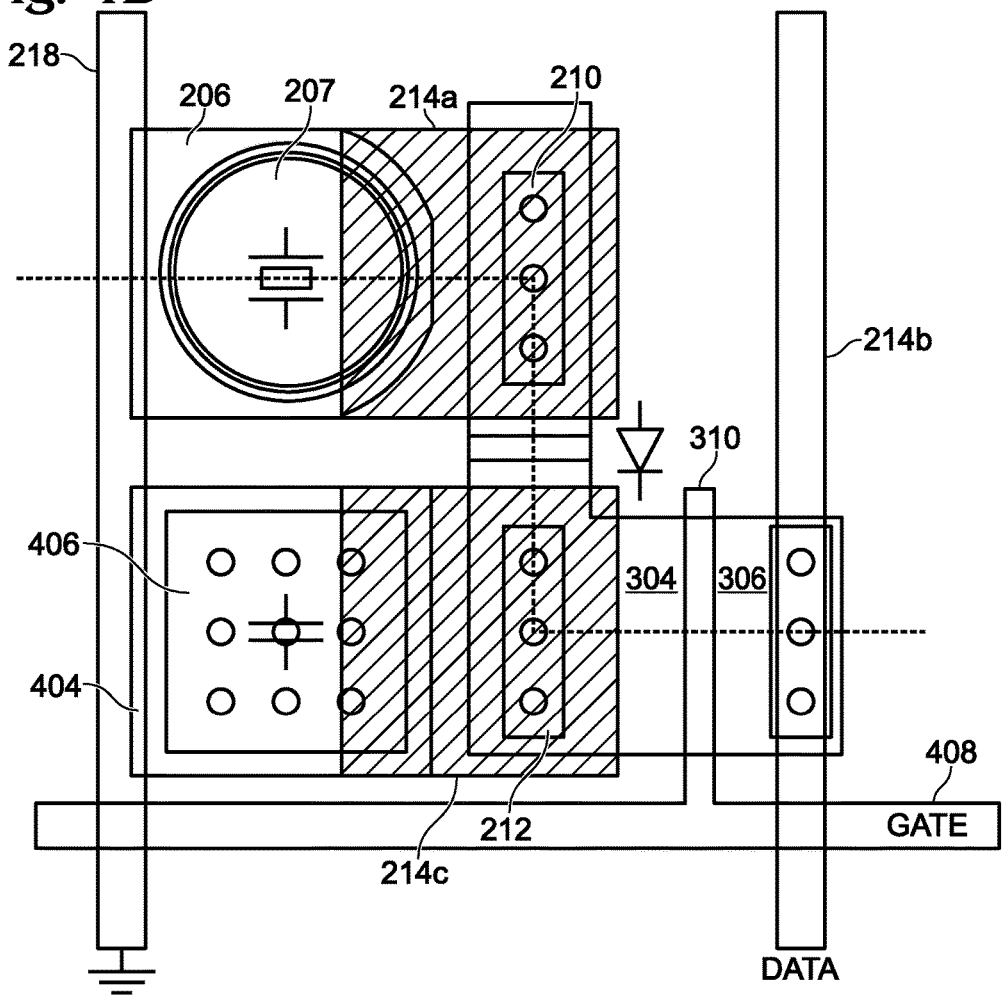

FIGS. 4A and 4B are, respectively, cross-sectional and plan views of a third exemplary piezoelectric sensor 400. A capacitor 402 has a bottom electrode 404 connected to the piezoelectric disk bottom electrode 206 (via contact 218), and a top electrode 406 connected to the diode cathode 212 via contact 214c (cross-hatched in FIG. 4B). In the plan view the gate electrode 310 can be seen connected to gate line 408. Electrical contact 214a is also shown as cross-hatched in FIG. 4B.

Common to all the examples shown in FIGS. 2, 3, 4A, and 4B, the piezoelectric material may be PZT, BaTiO$_3$, PVDF, P(VDF-TrFE), quartz, ZnO, AlN, or PZLT. Likewise, the substrate 202 may be glass or a plastic such as poly(methyl methacrylate) (PMMA), polyethylene terephthalate (PET), polyethelyne naphthalate (PEN), or polycarbonate (PC).

Due to the high temperatures required for sintering, the devices depicted in FIGS. 2, 3, 4A, and 4B could not have been made on plastic or glass substrates using conventional thin-film processes that would deposit, form, and anneal piezoelectric material in-situ at high temperatures. Likewise, due to the high electric fields required for poling, the devices depicted in FIGS. 2, 3, 4A, and 4B could not have been made using conventional thin-film processes due to the close proximity of active components such as transistors and diodes. Practically, these devices can only be made by completely forming and poling the piezoelectric disks prior to assembly with the other components on the substrate.

PZT disks can be formed on a growth substrate in a variety of ways, including molding of sol-gel PZT precursor or chemical solution deposition of sol-gel PZT. The former means of producing PZT disks has been shown in the literature as being able to form disks with a thickness of 1 m and a diameter of 80-200 microns (Gm). The latter was used to for larger, thicker disks with thicknesses of 10 μm and diameters of 100-500 μm. By forming the disks on a separate growth substrate, the sintering process can be carried out using optimized conditions for forming the PZT material (e.g., sintering at 650° C. for several hours). The disks can be formed on the growth substrate with top and bottom metal electrodes for low contact resistance. PZT disks can be harvested from the growth substrate by several methods, including laser lift-off with an excimer laser (e.g., 308 nm wavelength xenon monochloride (XeCl)) of directly-deposited PZT, undercutting of a Si sacrificial layer with xenon difluoride (XeF$_2$), or undercutting of an oxide sacrificial layer with vapor hydrofluoric (HF) acid.

Piezoelectric ceramic disks with high piezoelectric coefficients can be made with a diameter range between 10 and 150 m. The high piezoelectric coefficients can allow smaller disks to be utilized to maximize the transparency of the sensor array for incorporation onto a display or window.

Piezoelectric disks with top and bottom electrodes can also be fabricated on a growth substrate and harvested into a suspension. These disks can be poled prior to harvesting to maximize the piezoelectric coefficient. Poling is a process that induces a large electric field on the piezoelectric material, making the piezoelectric material sensitive to physical forces such as sound, pressure, and acceleration. After harvest from the growth substrate, piezoelectric disks are fluidically assembled into an array for fabrication of an ultrasonic sensor. Since the piezoelectric disks disclosed herein do not have an asymmetry in their electrical structure, orientation control is not a concern. Parent application Ser. No. 15/171,521 describes the fabrication of symmetrical piezoelectric plates.

Figure 5A:
FIGS. 5A through 5J depict an exemplary process for the fabrication of the device depicted in FIGS. 4A and 4B.
Figure 5B:
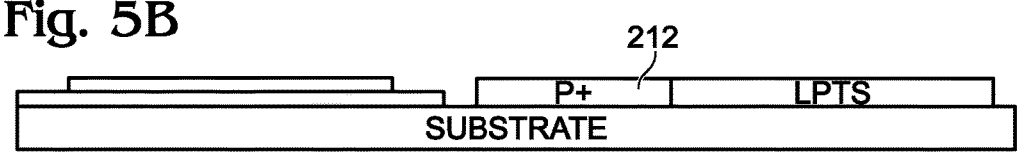

FIGS. 5A through 5J depict an exemplary process for the fabrication of the device depicted in FIGS. 4A and 4B. In FIG. 5A a bottom/ground electrode (e.g., Ta) 218 is deposited over the substrate 202. Note: in this example the cross-section follows the dotted line depicted in the plan view FIG. 4B. The layer 218 is patterned and etched to form the ground connection for the piezoelectric element and the capacitor. In FIG. 5B amorphous silicon (a-Si) is deposited and crystallized to form LTPS. The LTPS is patterned and the diode P+ region 212 is implanted.

Figure 5C:
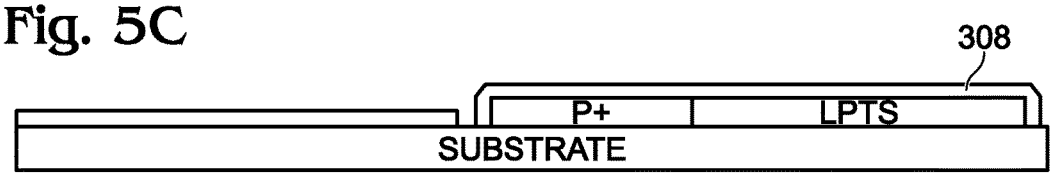
Figure 5D:
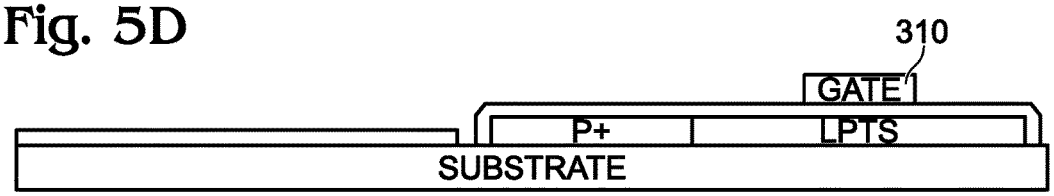
Figure 5E:
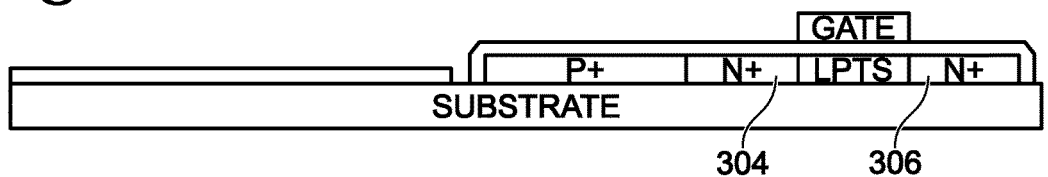

In FIG. 5C gate insulator (GI) silicon dioxide (SiO$_2$) 308 is deposited for the TFT and capacitor (not shown). In FIG. 5D gate metal 312 is deposited, as well as top metal for the capacitor (not shown). N+ regions 304 and 306 are patterned and implanted for the TFT S/D. An activation anneal for P+ and N+ regions then takes place at 550 to 600° C. for 4-5 hours. The strain point parameters for Corning Eagle XG and Corning 2000 glass are 650° C. Other glass substrates have similar characteristics. The strain point is not actually the melting point of glass, but is rather the upper limit for a serviceable glass substrate. Thus, the activation anneal is close to, but lower than a typical glass substrate strain point. Lower activation temperatures require longer annealing times, in a logarithmic relationship. For plastic substrates with lower working temperatures, an ultra-low temperature implant activation process may be used, such as laser annealing (e.g., excimer laser activation).

Figure 5F:
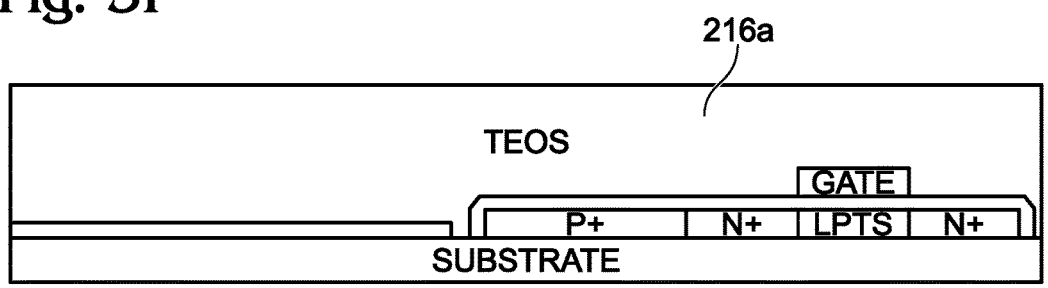
Figure 5G:
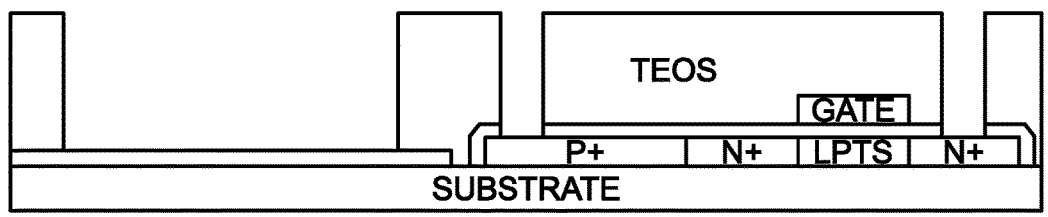
Figure 5H:
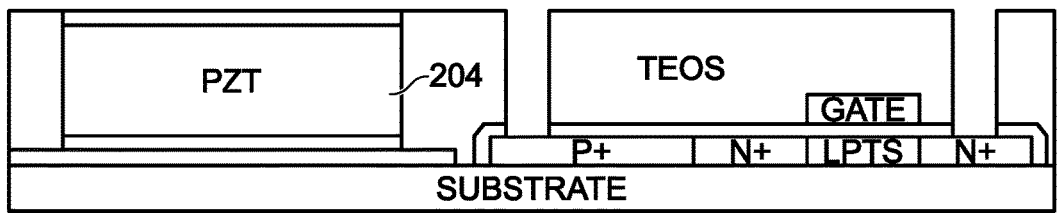

In FIG. 5F a 1-μm-thick TEOS layer 216a is deposited for the PZT disk well. Other materials can also be used, such as polyimides or spin-on glass (SOG). In FIG. 5G the disk well is opened, along with contact holes to TFT, P+ region of diode, and capacitor (not shown). In FIG. 5H the piezoelectric disk is shown aligned into the well after a fluidic assembly process.

Figure 5I:
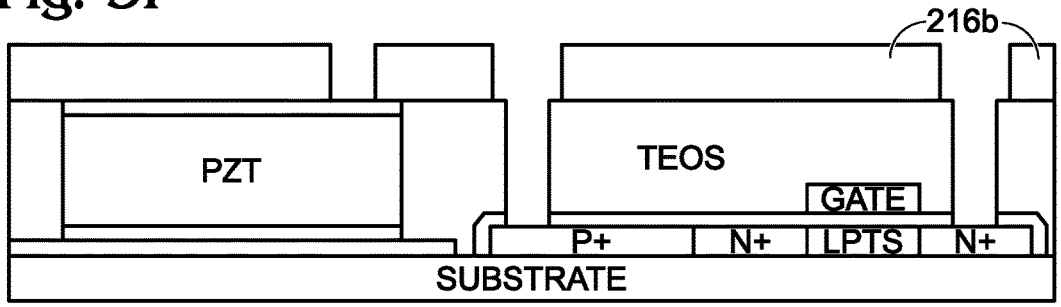
Figure 5J:
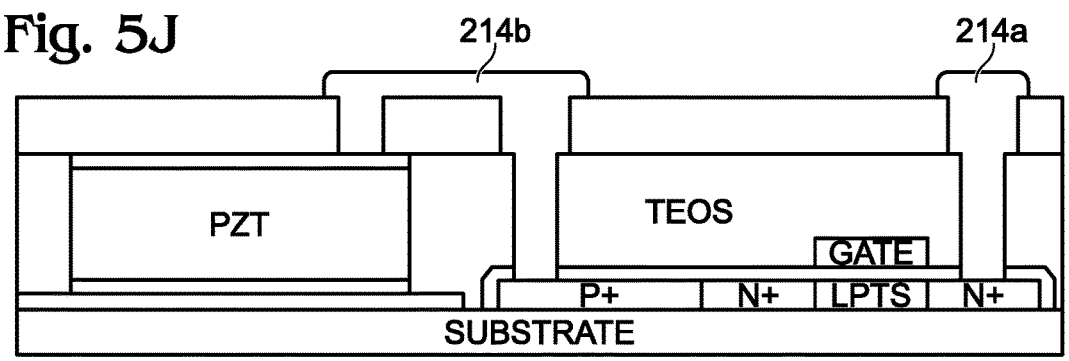
Figure 7:
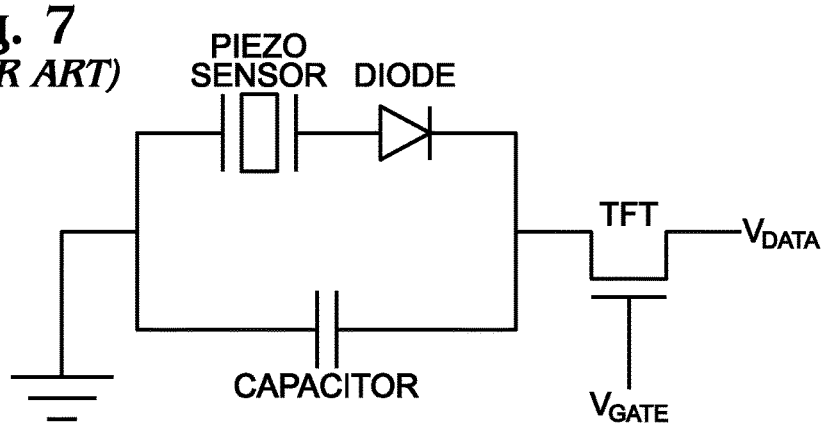
FIG. 7 is a schematic diagram of an exemplary piezoelectric sensor (prior art).

In FIG. 5I a passivation layer 216a of polyimide or some other photopatternable material is deposited and contact holes opened. In FIG. 5J top metal interconnect 214b and data line 214a are deposited and patterned. The metal may be a hybrid metal with indium tin oxide (ITO), for example, for improved transparency.

Figure 6:
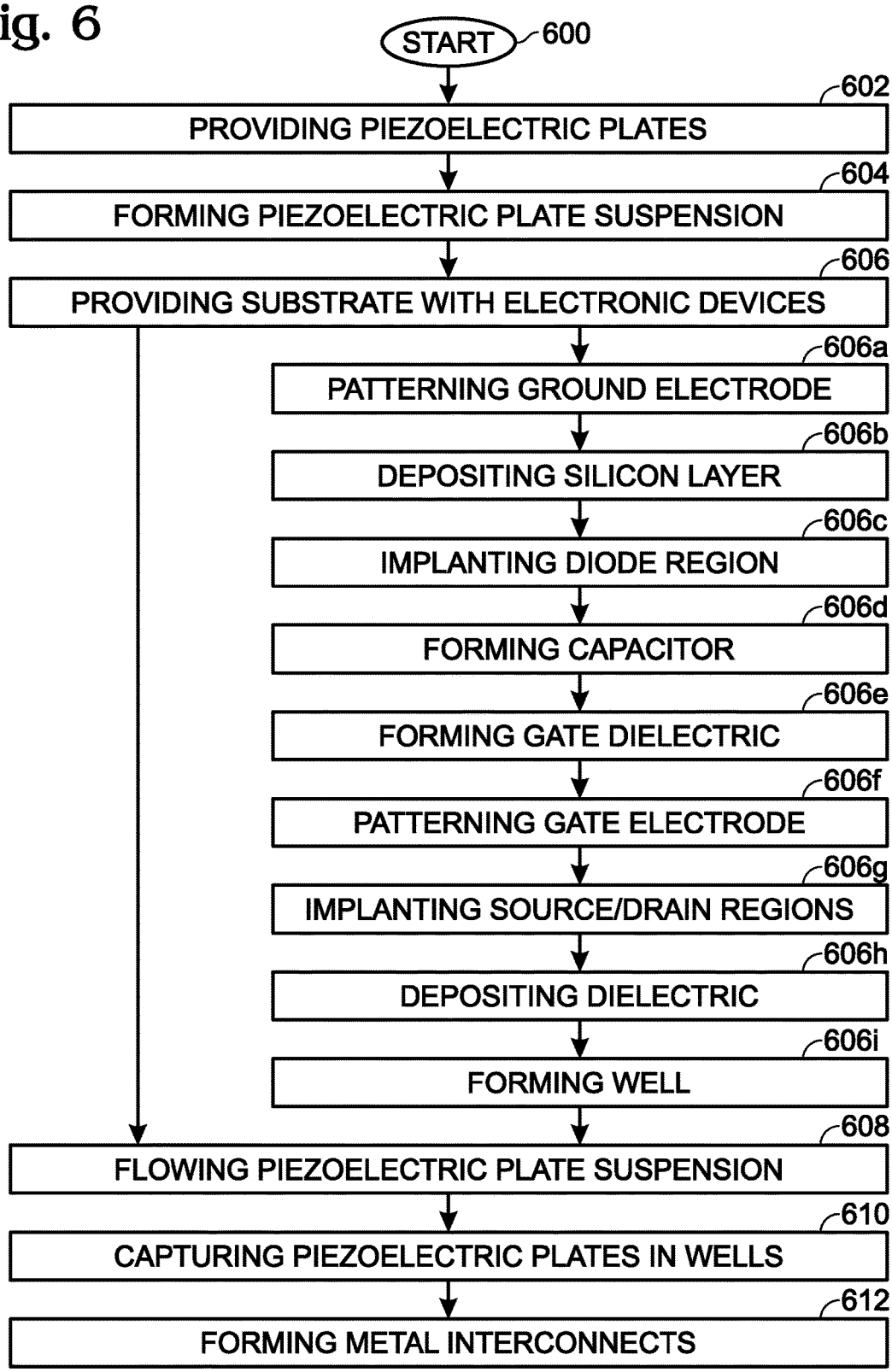
FIG. 6 is a flowchart illustrating a method for fabricating a thin-film electronic device employing a piezoelectric plate.

FIG. 6 is a flowchart illustrating a method for fabricating a thin-film electronic device employing a piezoelectric plate. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 600.

Step 602 provides a plurality of piezoelectric plates, each piezoelectric plate having a polygon shape and comprising a piezoelectric layer, a first electrode overlying a first surface of the piezoelectric layer, and a second electrode overlying a second surface of the piezoelectric layer. The polygon shape may be a disk, oval, triangle, or rectangle to list a few examples. Step 604 forms a piezoelectric plate suspension. Step 606 provides a substrate comprising a plurality of electronic devices, each electronic device including a top surface well. In one aspect, the active components (e.g., transistors and diodes) of the electronic devices have already been formed.

If the substrate is glass, it may have a strain point of about 650 degrees C., or less. If the substrate is plastic, it may have an upper working temperature of about 150 degrees C., or less. Some examples of plastic substrate materials include: poly(methyl methacrylate) (PMMA), polyethylene terephthalate (PET), polyethelyne naphthalate (PEN), polycarbonate (PC), polyethersulphone (PES), aromatic fluorine-containing polyarylates (PAR), polycyclic olefin (PCO), and polyimide (PI).

Step 608 flows the piezoelectric plate suspension over the substrate. In response to the piezoelectric plate suspension flow, Step 610 captures piezoelectric plates in the top surface wells.

Typically, the substrates provided in Step 606 have electric device top surface wells with well bottom surfaces, and bottom electrical contacts formed on the bottom surfaces. Then, capturing piezoelectric plates in the top surface wells in Step 610 includes, for each electronic device, interfacing either the piezoelectric plate electrode first electrode or second electrode to the bottom electrical contact. Since the piezoelectric plates are symmetrical, the plates are not limited to any particular orientation. Subsequent to capturing the piezoelectric plates in the top surface wells, Step 612 uses a thin-film process to form a conductive line overlying the unselected piezoelectric device electrode, for each electronic device.

As noted above, the piezoelectric plates provided in Step 602 may be made from one of following materials: lead zirconium titanate (PZT), barium titanate (BaTiO$_3$), polyvinylidene fluoride (PVDF), a polyvinylidene fluoride co-polymer (P(VDF-TrFE)), quartz, zinc oxide (ZnO), aluminum nitride (AlN), or lanthanum-doped lead zirconium titanate (PZLT). The process can also be applied to polymer piezoelectric materials. The piezoelectric plate first and second electrode may be one of the following: platinum (Pt), palladium (Pd), ruthenium oxide (RuO$_2$), or gold (Au). The first and second electrode materials need not necessarily be the same metal. In one aspect, the piezoelectric plates include an adhesion layer formed between the first electrode and the piezoelectric layer, where the adhesion layer is a material such as titanium (Ti), nickel (Ni), or chromium (Cr).

Additional details concerning the adhesion layer are provided in parent application Ser. No. 15/171,521. As also noted in Ser. No. 15/171,521, the piezoelectric plates provided in Step 602 have been (previously) annealed at a first temperature to induce poling of the piezoelectric material. For example, in the case of a PZT piezoelectric layer, the annealing may be at a first temperature of greater than 650° C.

In one specific example, Step 606 provides substrates comprising a plurality of electronic devices using the following substeps, see FIGS. 4A-4B and 5A-5J. Step 606a forms a patterned ground electrode overlying the substrate. Step 606b deposits a silicon layer on the substrate adjacent to the ground electrode. Step 606c implants a region of the silicon layer to form a first polarity diode region, where the first polarity may be either P+ or N+ and a second polarity is the opposite polarity. Step 606d forms a capacitor overlying the bottom electrode. Step 606e forms a gate dielectric layer overlying the silicon layer. Step 606f forms a patterned capacitor top electrode overlying the capacitor and a gate electrode overlying the gate dielectric. Step 606g implants the silicon layer adjacent to the gate electrode to form a first source/drain (S/D) region contacting the first polarity diode region, and a second S/D region, where the first and second S/D regions have the second polarity. Step 606h conformally deposits a dielectric and Step 606i forms the top surface well in the dielectric overlying the bottom electrode, and contact vias to the first diode region, second S/D region, and capacitor top electrode.

Subsequent to capturing piezoelectric plates in the top surface wells, Step 612 forms patterned metal interconnects to electrically interface the capacitor top electrode and piezoelectric disk exposed electrode, and a circuit output connected to the second N+S/D region.

Piezoelectric devices and an associated fluidic assembly process have been provided. Examples of particular materials and process steps have been presented to illustrate the invention. However, the invention is not limited to merely these examples. Other variations and embodiments of the invention will occur to those skilled in the art.

We claim:

1. A method for fabricating a thin-film electronic device employing a piezoelectric plate, the method comprising:
   providing a plurality of piezoelectric plates, each piezoelectric plate having a polygon shape and comprising a piezoelectric layer, a first electrode overlying a first surface of the piezoelectric layer, and a second electrode overlying a second surface of the piezoelectric layer;
   forming a piezoelectric plate suspension;
   providing a substrate comprising a plurality of electronic devices, each electronic device including a top surface well;
   flowing the piezoelectric plate suspension over the substrate; and,
   in response to the piezoelectric plate suspension flow, capturing piezoelectric plates in the top surface wells.

2. The method of claim 1 wherein providing the substrate comprising the plurality of electronic device includes providing electric device top surface wells having well bottom surfaces, with bottom electrical contacts formed on the bottom surfaces; and,
   wherein capturing piezoelectric plates in the top surface wells includes, for each electronic device, interfacing a piezoelectric plate electrode selected from the group consisting of the first electrode and the second electrode, to the bottom electrical contact.

3. The method of claim 2 further comprising:
   subsequent to capturing the piezoelectric plates in the top surface wells, for each electronic device, using a thin-film process to form a conductive line overlying the unselected piezoelectric device electrode.

4. The method of claim 1 wherein providing the piezoelectric plates includes providing piezoelectric plates formed from a piezoelectric material selected from a group consisting of lead zirconium titanate (PZT), barium titanate (BaTiO$_3$), polyvinylidene fluoride (PVDF), a polyvinylidene fluoride co-polymer (P(VDF-TrFE)), quartz, zinc oxide (ZnO), aluminum nitride (AlN), or lanthanum-doped lead zirconium titanate (PZLT).

5. The method of claim 1 wherein providing the piezoelectric plates includes providing piezoelectric plates with a first electrode material selected from a group consisting of platinum (Pt), palladium (Pd), ruthenium oxide (RuO$_2$), or gold (Au), and a second electrode material selected from a group consisting of Pt, Pd, RuO$_2$, or Au.

6. The method of claim 1 wherein providing the piezoelectric plates includes providing piezoelectric plates with an adhesion layer formed between the first electrode and the piezoelectric layer, where the adhesion layer is a material selected from a group consisting of titanium (Ti), nickel (Ni), or chromium (Cr).

7. The method of claim 1 wherein providing the piezoelectric plates includes providing piezoelectric plates having a disk shape.

8. The method of claim 1 wherein providing the piezoelectric plates includes providing piezoelectric plates annealed at a first temperature to induce poling of the piezoelectric material.

9. The method of claim 8 wherein providing the piezoelectric plates includes providing piezoelectric plates having a PZT piezoelectric layer, annealed at a first temperature of greater than 650° C.

10. The method of claim 1 wherein providing the substrate comprising the plurality of electronic devices includes forming piezoelectric sensors as follows:
    forming a patterned ground electrode overlying the substrate;
    depositing a silicon layer on the substrate adjacent to the ground electrode;
    implanting a region of the silicon layer to form a first polarity diode region, where the first polarity is selected from the group consisting of P+ and N+ and a second polarity is unselected from the group;
    forming a capacitor overlying the bottom electrode;
    forming a gate dielectric layer overlying the silicon layer;
    forming a patterned capacitor top electrode overlying the capacitor and a gate electrode overlying the gate dielectric;
    implanting the silicon layer adjacent to the gate electrode to form a first source/drain (S/D) region contacting the first polarity diode region, and a second S/D region, where the first and second S/D regions have the second polarity;
    conformally depositing a dielectric; and,
    forming the top surface well in the dielectric overlying the bottom electrode, and contact vias to the first diode region, second S/D region, and capacitor top electrode.

11. The method of claim 10 further comprising:
    subsequent to capturing piezoelectric plates in the top surface wells, forming patterned metal interconnects to electrically interface the capacitor top electrode and piezoelectric disk exposed electrode, and a circuit output connected to the second N+S/D region.

12. The method of claim 1 wherein providing the substrate includes providing a glass substrate having a strain point temperature of about 650 degrees C., or less.

13. The method of claim 1 wherein providing the substrate includes providing a plastic substrate having an upper working temperature of about 150 degrees C., or less.

14. The method of claim 12 wherein the substrate is a material selected from a group consisting of glass and plastic including poly(methyl methacrylate) (PMMA), polyethylene terephthalate (PET), polyethelyne naphthalate (PEN), polycarbonate (PC), polyethersulphone (PES), aromatic fluorine-containing polyarylates (PAR), polycyclic olefin (PCO), and polyimide (PI).

15. A piezoelectric sensor comprising:
   a substrate having an upper temperature limit of 650 degrees C., or less;
   a piezoelectric disk overlying the substrate having a bottom electrode and a top electrode;
   a diode having an anode connected to the piezoelectric disk top electrode, and a cathode to supply a sensor output; and,
   a thin-film transistor (TFT) having a first source/drain (S/D) region connected to the diode cathode and a second S/D region to supply the sensor output.

16. The piezoelectric sensor of claim 15 further comprising:
   a capacitor having a bottom electrode connected to the piezoelectric disk bottom electrode, and a top electrode connected to the diode cathode.

17. The piezoelectric sensor of claim 15 wherein the piezoelectric material is selected from a group consisting of lead zirconium titanate (PZT), barium titanate (BaTiO$_3$), polyvinylidene fluoride (PVDF), a polyvinylidene fluoride co-polymer (P(VDF-TrFE)), quartz, zinc oxide (ZnO), aluminum nitride (AlN), or lanthanum-doped lead zirconium titanate (PZLT).

18. The piezoelectric sensor of claim 15 wherein the substrate is a material selected from a group consisting of glass and plastic including poly(methyl methacrylate) (PMMA), polyethylene terephthalate (PET), polyethelyne naphthalate (PEN), and polycarbonate (PC).

19. The piezoelectric sensor of claim 15 wherein the substrate is a plastic substrate having an upper working temperature of 150 degrees C., or less.

* * * * *